United States Patent
Lin et al.

(10) Patent No.: US 10,117,305 B2
(45) Date of Patent: Oct. 30, 2018

(54) DRIVING SYSTEM AND METHOD FOR PLANAR ORGANIC ELECTROLUMINESCENT DEVICE

(71) Applicant: Industrial Technology Research Institute, Hsinchu (TW)

(72) Inventors: Hsuan-Yu Lin, Changhua County (TW); Cheng-Yen Tsai, Keelung (TW); Sue-Chen Liao, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/260,335

(22) Filed: Sep. 9, 2016

(65) Prior Publication Data

US 2017/0325312 A1    Nov. 9, 2017

(30) Foreign Application Priority Data

May 9, 2016 (CN) .......................... 2016 1 0300644

(51) Int. Cl.
*H05B 33/08* (2006.01)
*H01L 27/32* (2006.01)
*H01L 51/52* (2006.01)

(52) U.S. Cl.
CPC ......... *H05B 33/0896* (2013.01); *H01L 27/32* (2013.01); *H01L 27/3293* (2013.01);
(Continued)

(58) Field of Classification Search
CPC .............. H05B 33/0824; H05B 33/083; H05B 33/0857; H05B 33/0863; H05B 33/0803;
(Continued)

(56) References Cited

U.S. PATENT DOCUMENTS

| 7,701,428 | B2 | 4/2010 | Stumbo et al. |
| 7,888,861 | B2 | 2/2011 | Custodis |

(Continued)

FOREIGN PATENT DOCUMENTS

| CN | 103139954 | 6/2013 |
| CN | 104485428 | 4/2015 |

(Continued)

*Primary Examiner* — Alexander H Taningco
*Assistant Examiner* — Renan Luque
(74) *Attorney, Agent, or Firm* — JCIPRNET

(57) ABSTRACT

A driving system and a driving method for a planar organic electroluminescent device are provided. The light emitting device has multiple light emitting elements, each having a first electrode and a second electrode. The driving system includes a first circuit, a second circuit, a driving module, and a ground circuit. The first circuit is connected to and provides a constant voltage to the first electrode of each light emitting element. The second circuit is connected to the second electrode of each light emitting element. The driving module is respectively connected to the second electrode of each light emitting element through the second circuit. The ground circuit is connected to the driving module and connects each light emitting element to the ground. The first electrodes of the light emitting elements are connected to one another, and the light emitting elements are driven by a constant current output by the driving module.

20 Claims, 12 Drawing Sheets

(52) U.S. Cl.
CPC ...... *H01L 51/5212* (2013.01); *H01L 51/5228* (2013.01); *H01L 2251/5361* (2013.01)

(58) Field of Classification Search
CPC ......... H01L 25/0753; H01L 2924/0002; H01L 2924/00; H01L 27/3211; H01L 27/3213; H01L 25/167; H01L 25/18; H01L 25/50; H01L 27/156; H01L 27/3255; H01L 33/62; C09K 11/586; C09K 11/623; C09K 11/7421; C09K 11/7702; C09K 11/7721; C09K 11/7734; F21K 9/00; G09G 3/2003; G09G 3/3208; G09G 2300/0452; G09G 2300/0443; G09G 2320/0242; G09G 2320/0666; G09G 2300/0426; G09G 2300/0842; G09G 2310/0221; G09G 2310/0286; G09G 2320/0233; G09G 3/20; G09G 3/2088; G09G 3/32; G09G 3/3611; H04N 5/376
See application file for complete search history.

(56) References Cited

U.S. PATENT DOCUMENTS

| | | |
|---|---|---|
| 8,680,519 B1 | 3/2014 | Liu et al. |
| 8,710,522 B2 | 4/2014 | Li et al. |
| 2004/0252096 A1* | 12/2004 | Wang .................... G09G 3/3208 345/102 |
| 2010/0039030 A1* | 2/2010 | Winters .............. H01L 27/3248 313/505 |
| 2010/0207852 A1* | 8/2010 | Cok ......................... G09G 3/20 345/83 |
| 2013/0293142 A1 | 11/2013 | Van De Sluis et al. |
| 2014/0292223 A1* | 10/2014 | Hirasawa ............ H01L 27/3211 315/293 |
| 2014/0327359 A1* | 11/2014 | Masazumi .......... H01L 27/3204 315/122 |
| 2015/0371585 A1* | 12/2015 | Bower .................... G09G 3/32 345/1.1 |
| 2016/0093600 A1* | 3/2016 | Bower ................. H01L 25/167 257/89 |
| 2017/0025075 A1* | 1/2017 | Cok ................... H05B 33/0806 |
| 2017/0061867 A1* | 3/2017 | Cok ...................... G09G 3/3208 |
| 2017/0186740 A1* | 6/2017 | Cok ................... H01L 27/0207 |
| 2017/0256522 A1* | 9/2017 | Cok ................... H01L 25/0753 |

FOREIGN PATENT DOCUMENTS

| | | |
|---|---|---|
| TW | I260949 | 8/2006 |
| TW | I487088 | 6/2015 |

* cited by examiner

DRIVING SYSTEM AND METHOD FOR PLANAR ORGANIC ELECTROLUMINESCENT DEVICE

CROSS-REFERENCE TO RELATED APPLICATION

This application claims the priority benefit of China application serial no. 201610300644.1, filed on May 9, 2016. The entirety of the above-mentioned patent application is hereby incorporated by reference herein and made a part of this specification.

TECHNICAL FIELD

The disclosure relates to a driving system and a driving method, and particularly relates to a driving system and a driving method for a planar organic electroluminescent device.

BACKGROUND

Compared with conventional light sources such as incandescent lamp, fluorescent lamp, etc., light emitting diode (LED) light sources and organic light emitting diode (OLED) light sources have the characteristics of being thin and light, mercury-free, and ultraviolet light-free, and may serve as planar light sources. Thus, LED and OLED light sources are considered as light sources that are emerging and full of potential.

FIG. 1 is a view illustrating a conventional light emitting device adopting a plurality of organic electroluminescent elements. Referring to FIG. 1, a light emitting device 100 includes a plurality of organic electroluminescent elements 110A to 110C (FIG. 1 only illustrates three of the elements), a plurality of connection circuit boards 120 (FIG. 1 only illustrates three of the boards), a power circuit 130, and a ground circuit 140.

Referring to FIG. 1, the organic electroluminescent elements 110A to 110 C are connected to one another in series through the connection circuit boards 120. In addition, the power circuit 130 provides a constant current to the organic electroluminescent elements 110A to 110C to make the organic electroluminescent elements 110A to 110C emit light.

In the light emitting device 100, since the organic electroluminescent elements 110A to 110C are connected to one another in series, when one (e.g., the organic electroluminescent element 110A) of the organic electroluminescent elements 110A to 110C malfunctions and becomes an open circuit (e.g., always-OFF state), the rest organic electroluminescent elements 110B and 110C may not emit light.

Detailed descriptions with reference to FIG. 1 are provided as follows. When the organic electroluminescent element 110A malfunctions and becomes the open circuit, the organic electroluminescent elements 110B and 110C do not emit light. When the organic electroluminescent element 110B malfunctions and becomes the open circuit, the organic electroluminescent element 110A still emits light, but the organic electroluminescent element 110C does not emit light.

In addition, when one of the organic electroluminescent elements 110A to 110C (e.g., the organic electroluminescent element 110B) malfunctions and becomes a short circuit (e.g., always-ON state), the organic electroluminescent element 110B, which is the short circuit, may become a resistor that does not emit light but consumes power. For example, when the organic electroluminescent element 110A malfunctions and becomes the short circuit, even though the organic electroluminescent elements 110B and 110C still emit light, the organic electroluminescent element 110A may still consume power.

Thus, the light emitting efficiency of the light emitting device 100 may become worse if one of the organic electroluminescent elements 110A to 110C malfunctions.

In addition, in the conventional light emitting device 100, since the organic electroluminescent elements 110A to 110C are connected in series, the light emitting device 100 needs a high driving voltage, which increases the risk of electric shock.

Besides, the light emitting device 100 of FIG. 1 does not permit cutting. Cutting in any form may lead to damages to the electrical connection of the organic electroluminescent elements 110A to 110C and thus makes the light emitting efficiency of the light emitting device 100 worse. Moreover, when the light emitting device 100 with a predetermined area is required, such device must be ordered in advance from the manufacturer. Thus, the cost of the light emitting device 100 is higher, and the time required for manufacturing the light emitting device 100 is also longer.

SUMMARY

The disclosure provides a driving system and a driving method for a planar organic electroluminescent device that connects a plurality of light emitting elements to one another and drives the light emitting elements with a constant current output by a driving module. In this way, a large-sized light emitting device may be manufactured in advance, and a light emitting device with a desired size and shape may be obtained by performing a cutting process. The light emitting device after being cut still has a preferable light emitting efficiency. Moreover, the light emitting device may be driven by a lower voltage to avoid an electric shock. With a design of a sheet resistance, the light emitting device after being cut is able to automatically adjust a driving current.

An embodiment of the disclosure provides a driving system for a planar organic electroluminescent device. The planar organic electroluminescent device has a plurality of light emitting devices. Each of the light emitting devices has a first electrode and a second electrode. The driving system for the planar organic electroluminescent device includes: a first circuit connected to the first electrode of each of the light emitting elements and providing a constant voltage to each of the light emitting elements; the second circuit connected to the second electrode of each of the light emitting elements; a driving module connected to the second electrode of each of the light emitting elements through the second circuit; and a ground circuit connected to the driving module and connecting each of the light emitting elements to the ground. In addition, the first electrodes of the light emitting elements are connected to one another, and the light emitting elements are driven by a constant current output by the driving module.

An embodiment of the disclosure also provides a driving method for a planar organic electroluminescent device. The method includes: providing the driving system for the planar organic electroluminescent device; providing the constant voltage to each of the light emitting elements by using the first circuit; and providing a driving signal to each of the light emitting elements through the second circuit by using the driving module, so as to drive an operation of each of the light emitting elements.

Based on the above, in the driving system and the driving method for a planar organic electroluminescent device according to the embodiments of the disclosure, a plurality of light emitting elements are connected to one another and driven by a constant current output. In this way, the large-sized light emitting device may be manufactured in advance, and the light emitting device with a desired size and shape may be obtained by performing a cutting process. The light emitting device after being cut still has a preferable light emitting efficiency. Moreover, the light emitting device may be driven by a lower voltage to avoid an electric shock. With a design of a sheet resistance, the light emitting device after being cut is able to automatically adjust a driving current.

In the embodiments of the disclosure, a range of a driving current (constant current) output by the driving module may be set based on an external resistance. In addition, the driving current (constant current) may be further set based on a resistance value of the sheet resistance. Specifically, if the light emitting element is cut, which results in a change in an area of the sheet resistance, the resistance value of the sheet resistance is also changed, and a divided voltage of the light emitting element is also changed. After the divided voltage functions at the driving module of an "input voltage reference type", the constant current (driving current) output by the driving module is also changed, thereby achieving automatic adjustment to the driving current (constant current).

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 2:
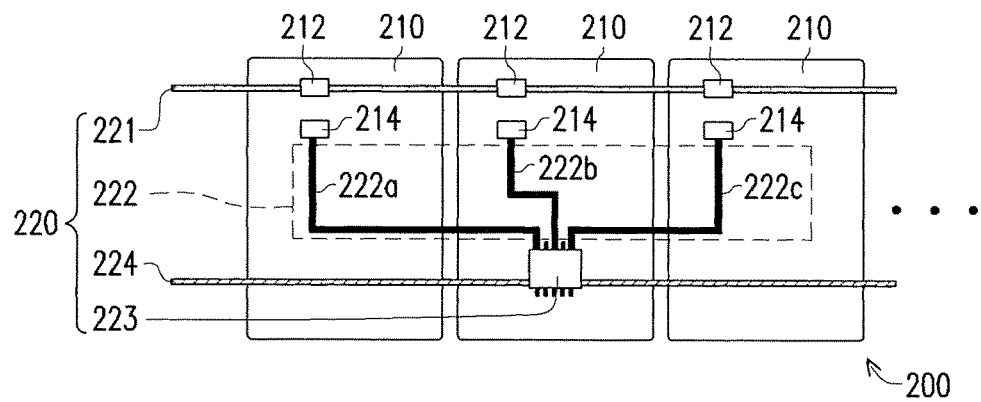
FIG. 2 is a schematic view illustrating a planar organic electroluminescent device and a driving system for the planar organic electroluminescent device according to an embodiment of the disclosure.

FIG. 2 is a schematic view illustrating a planar organic electroluminescent device and a driving system for the planar organic electroluminescent device according to an embodiment of the disclosure. Referring to FIG. 2, a planar organic electroluminescent device 200 may have a plurality of light emitting elements 210. Each of the light emitting elements 210 has a first electrode 212 and a second electrode 214. The first electrode 212 may be an anode (+) configured to input holes, and the second electrode 214 may be a cathode (−) configured to input electrons. The electrons and holes are combined at a light emitting layer of the light emitting element 210 to emit light. The light emitting element 210 may be an organic electroluminescent element. Using an organic electroluminescent element as the light emitting element 210 allows manufacture of a large-sized device, and the light emitting element 210 may be flexible as well as cuttable.

Referring to FIG. 2 again, a driving system 220 for the planar organic electroluminescent device 200 may include: a first circuit 221, a second circuit 222, a driving module 223, and a ground circuit 224. The first circuit 221 is connected to the first electrode 212 of each light emitting element 210, and the first circuit 221 provides a constant voltage to each light emitting element 210. The second circuit 222 is connected to the second electrode 214 of each light emitting element 210. The driving module 223 is connected to the second electrode 214 of each light emitting element 210 through the second circuit 222. The ground circuit 224 is connected to the driving module 223 and connects each light emitting element 210 to the ground. In addition, the first electrodes 212 of a plurality of the light emitting elements 210 are connected to one another, and the light emitting elements 210 are driven by a constant current output by the driving module 223.

The constant voltage may be in a range from 12 volts (V) to 24V, lower than a high voltage of the conventional light emitting device 100 adopting a serial connection.

Figure 1:
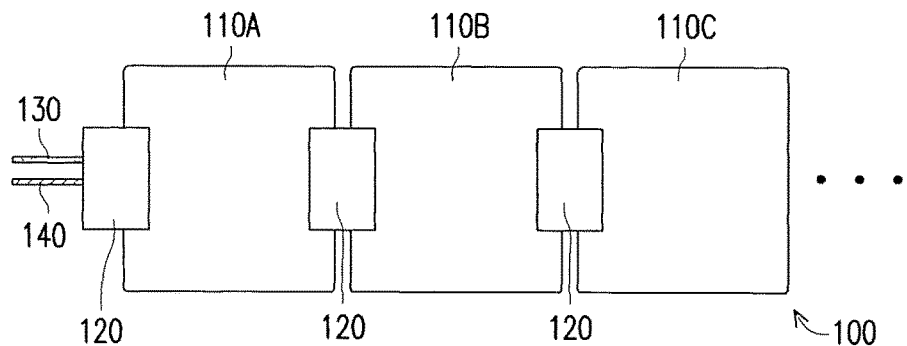
FIG. 1 is a view illustrating a conventional light emitting device adopting a plurality of organic electroluminescent elements.

As shown in FIG. 2, in the driving system 220 for the planar organic electroluminescent device 200, since the first electrodes 212 of the light emitting elements 210 are connected to one another, and the driving module 223 may provide the constant current for driving to each light emitting element 210 through the second circuit 222, even if one of the light emitting elements 210 malfunctions, the rest light emitting elements 210 are still able to emit light. Compared with the conventional light emitting device 100 shown in FIG. 1, overall light emission of the planar organic electroluminescent device 200 is not affected by an individual malfunctioning light emitting element 210.

In addition, as long as the driving system 220 for the planar organic electroluminescent device 200 operates normally, when a cutting process is performed to the planar organic electroluminescent device 200, the cut planar organic electroluminescent device 200 may still emit light normally. Thus, a large-sized planar organic electroluminescent device 200 may be manufactured in advance. Then, when specifications are available, a suitable cutting process may be performed to manufacture the planar organic electroluminescent device 200 in any shape and size.

Referring to FIG. 2 again, the driving module 223 may be disposed on at least one of the light emitting elements 210. The first circuit 221, the second circuit 222, and the ground circuit 224 are disposed on the light emitting elements 210. The second circuit 222 includes a plurality of sub-circuits 222a, 222b, and 222c. Each of the sub-circuits 222a, 222b, and 222c respectively connects each of the second electrodes 214 and the driving module 223. Namely, as shown in FIG. 2, the sub-circuit 222a connects the second electrodes 214 of the light emitting element 210 in the left and the driving module 223, the sub-circuit 222b connects the second electrode 214 of the light emitting element 210 in the middle and the driving module 223, and the sub-circuit 222c connects the second electrode 214 of the light emitting element 210 in the right and the driving module 223.

In the embodiment of FIG. 2, the light emitting elements 210 may be connected by adopting "board-to-board connection". Specifically, the board-like light emitting elements 210 may be connected by disposing a connector. The connector may be disposed between two adjacent light emitting elements 210. In addition, the driving module 223 may be disposed at the light emitting element 210 in the middle, so that the light emitting element 210 in the middle may serve as a master light emitting element, and the light emitting elements 210 at ends may serve as slave light emitting elements. As long as the driving module 223 on the master light emitting element operates normally, even if part of the light emitting elements 210 malfunctions, the whole planar organic electroluminescent device 200 may still emit light normally.

Figure 3:
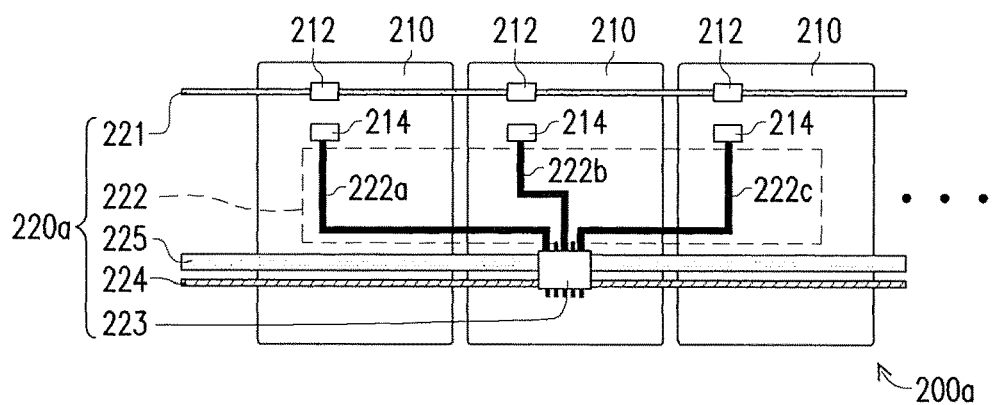
FIG. 3 is a schematic view illustrating a planar organic electroluminescent device and a driving system for the planar organic electroluminescent device according to another embodiment of the disclosure.

FIG. 3 is a schematic view illustrating a planar organic electroluminescent device and a driving system for the planar organic electroluminescent device according to another embodiment of the disclosure. The embodiment of FIG. 3 is similar to the embodiment of FIG. 2. Thus, similar contents will not be repeated in the following. In FIG. 3, components that are the same as those in FIG. 2 are referred to by the same reference numerals.

Referring to FIG. 3, in this embodiment, a driving system 220a for a planar organic electroluminescent device 200a may further include a control circuit 225 connected to the driving module 223. By inputting a dimming signal to the driving module 223 through the control circuit 225, dimming control may be exerted on each light emitting element 210. The dimming control refers to, for example, independent control on brightness, color temperature, etc., of each light emitting element 210.

In addition, in the embodiment shown in FIG. 3, when the driving system 220a for the planar organic electroluminescent device 200a has the control circuit 225, the first circuit 221, the second circuit 222, the ground circuit 224, and the control circuit 225 are disposed on the light emitting elements 210. Namely, the control circuit 225 is also disposed on the light emitting elements 210.

Figure 4:
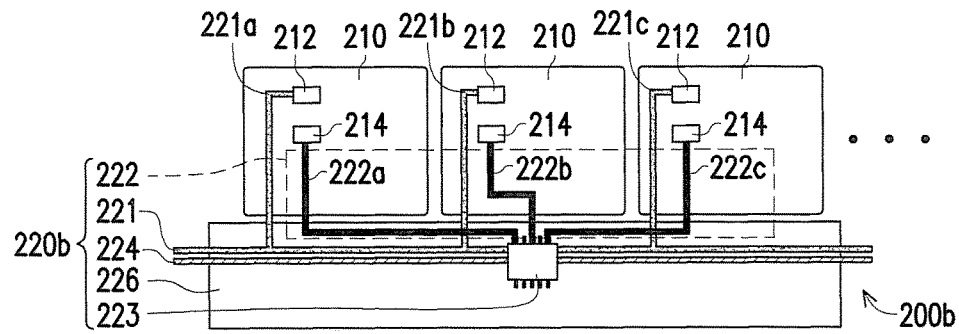
FIG. 4 is a schematic view illustrating a planar organic electroluminescent device and a driving system for the planar organic electroluminescent device according to yet another embodiment of the disclosure.

FIG. 4 is a schematic view illustrating a planar organic electroluminescent device and a driving system for the planar organic electroluminescent device according to yet another embodiment of the disclosure. In FIG. 4, components that are the same as those in FIG. 2 are referred to by the same reference numerals and will not be repeated in the following. Referring to FIG. 4, in this embodiment, the light emitting elements 210 are connected by adopting "board-to-lamp base connection". More specifically, a lamp base (i.e., connection circuit board 226) may be disposed, and the board-like light emitting elements 210 are electrically connected through the lamp base. A driving system 220b for a planar organic electroluminescent device 200b may further include a connection circuit board 226. In addition, the driving module 223 is disposed on the connection circuit board 226. Part of the first circuit 221, part of the second circuit 222, and the ground circuit 224 are disposed on the connection circuit board 226. The first circuit 221 includes a plurality of first sub-circuits 221a, 221b, and 221c. Each of the first sub-circuits 221a, 221b, and 221c is respectively connected to each first electrode 212. The second circuit 222 includes a plurality of second sub-circuits 222a, 222b, and 222c, and each of the second sub-circuits 222a, 222b, and 222c is respectively connected to each second electrode 214 and the driving module 223.

Figure 5:
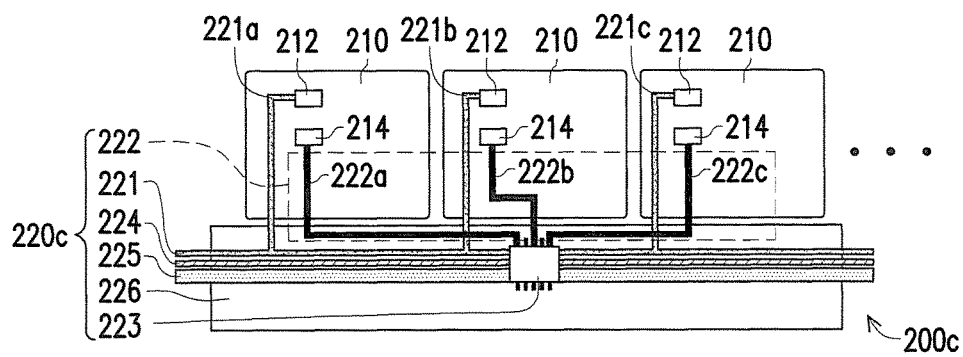
FIG. 5 is a schematic view illustrating a planar organic electroluminescent device and a driving system for the planar organic electroluminescent device according to still another embodiment of the disclosure.

FIG. 5 is a schematic view illustrating a planar organic electroluminescent device and a driving system for the planar organic electroluminescent device according to still another embodiment of the disclosure. In FIG. 5, components that are the same as those in FIG. 4 are referred to by the same reference numerals and will not be repeated in the following. Referring to FIG. 5, a driving system 220c for a planar organic electroluminescent device 200c may have the control circuit 225. In addition, part of the first circuit 221, part of the second circuit 222, the ground circuit 224, and the control circuit 225 are disposed on the connection circuit board 226. In other words, the control circuit 225 may be disposed on the connection circuit board 226.

The embodiments shown in FIG. 2 to FIG. 5 illustrate various circuit connections that use one driving module 223 to drive multiple light emitting elements 210. In addition, the embodiments also illustrate the circuit connections where the control circuit 225 is provided. Moreover, the control circuit 225 may be used to dim each of the light emitting elements 210.

Figure 6:
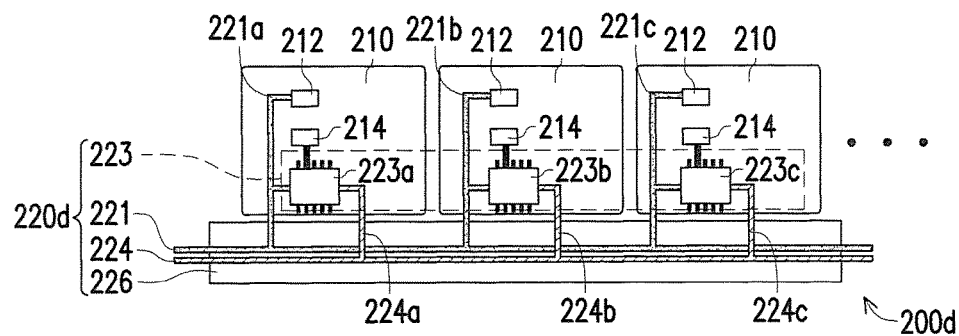
FIG. 6 is a schematic view illustrating a planar organic electroluminescent device and a driving system for the planar organic electroluminescent device according to yet another embodiment of the disclosure.

FIG. 6 is a schematic view illustrating a planar organic electroluminescent device and a driving system for the planar organic electroluminescent device according to yet another embodiment of the disclosure. In FIG. 6, components that are the same as those in FIG. 2 are referred to by the same reference numerals and will not be repeated in the following. Referring to FIG. 6, in this embodiment, the light emitting elements 210 are connected by adopting "rail connection". Specifically, each light emitting element 210 has its own driver (e.g., drivers 223a, 223b, 223c), and each light emitting element 210 is connected to the connection circuit board 226 to receive power for driving.

A driving system 220d for a planar organic electroluminescent device 200d shown in FIG. 6 may further include a connection circuit board 226. In addition, the first circuit 221 and the ground circuit 224 are disposed on the connection circuit board 226. The driving module 223 includes the drivers 223a, 223b, and 223c. Each of the drivers 223a, 223b, and 223c is correspondingly disposed on each light emitting element 210. The first circuit 221 includes a plurality of first sub-circuits 221a, 221b, and 221c. Each of the first sub-circuits 221a, 221b, and 221c is correspondingly connected to each first electrode 212 and each of the drivers 223a, 223b, and 223c. The ground circuit 224 includes a plurality of ground sub-circuits 224a, 224b, and 224c. The respective ground sub-circuits 224a, 224b, and 224c are correspondingly connected to the respective drivers 223a, 223b, and 223c. In the embodiment of FIG. 6, the respective light emitting elements 210 may be respectively provided with their own drivers 223a, 223b, and 223c for independent driving.

Figure 7A:
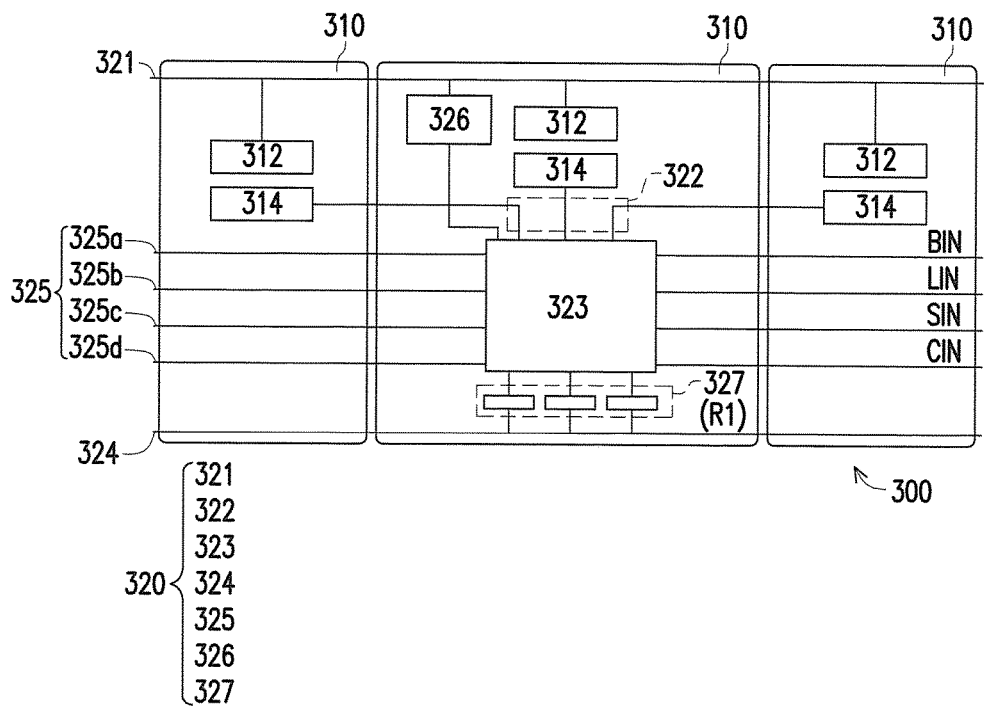
FIG. 7A is a circuit view illustrating a planar organic electroluminescent device and a driving system for the planar organic electroluminescent device according to an embodiment of the disclosure.

FIG. 7A is a circuit view illustrating a planar organic electroluminescent device and a driving system for the planar organic electroluminescent device according to an embodiment of the disclosure. Referring to FIG. 7A, a planar organic electroluminescent device 300 may have a plurality of light emitting elements 310. Each light emitting element 310 has a first electrode 312 and a second electrode 314. A driving system 320 for the planar organic electroluminescent device 300 may include: a first circuit 321, a second circuit 322, a driving module 323, a ground circuit 324, and a control circuit 325. The first circuit 321 is connected to the first electrode 312 of each light emitting element 310, and the first circuit 321 provides a constant voltage to each light emitting element 310. The second circuit 322 is connected to the second electrode 314 of each light emitting element 310. The driving module 323 is connected to the second electrode 314 of each light emitting element 310 through the second circuit 322. The ground circuit 324 is connected to the driving module 323 and connects each light emitting element 310 to the ground. In addition, the first electrodes 312 of the light emitting elements 310 are connected to one another, and the light emitting elements 310 are driven by a constant current output by the driving module 323.

The control circuit 325 is connected to the driving module 323. By inputting a dimming signal to the driving module 323 through the control circuit 325, dimming control may be exerted on each light emitting element 310. As shown in the circuit view of FIG. 7A, four control sub-circuits 325a, 325b, 325c, and 325d may be used to respectively transmit dimming signals BIN, LIN, SIN, and CIN to exert dimming control on the respective light emitting elements 310. The dimming control of the light emitting elements 310 may be implemented by addressable control or sequential control, for example. People having ordinary skills in the art are able to implement the dimming control based on related technical knowledge. Thus, details in this regard will not be described.

In addition, the driving system 320 for the planar organic electroluminescent device 300 may further include a voltage adjustment circuit 326 connected between the first circuit 321 and the driving module 323. The voltage adjustment circuit 326 adjusts the constant voltage to be provided to the driving module 323. For example, the constant voltage provided by the first circuit 321 is 12V, and is adjusted to 5V by the voltage adjustment circuit 326 before being provided to the driving module 323.

Figure 7B:
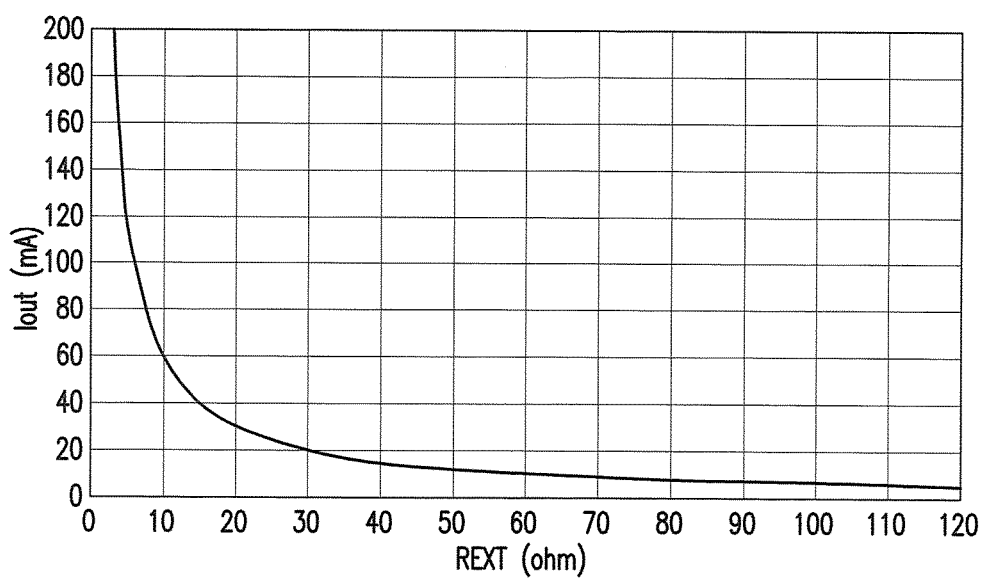
FIG. 7B is a diagram illustrating a relation between an output current (being output from the driving system 320 as shown in FIG. 7A) and an external resistance (i.e., the resistor module 327 as shown in FIG. 7A).

In addition, the driving system 320 for the planar organic electroluminescent device 300 may further include a resistor module 327 connected between the driving module 323 and the ground circuit 324. The resistor module 327 may serve as an external resistance R1. In other words, based on a resistor value of the resistor module 327 (the external resistance R1), the driving module 323 may determine the constant current output to the second electrodes 314 of the light emitting element 310. FIG. 7B is a diagram illustrating a relation between an output current (being output from the driving system 320 as shown in FIG. 7A) and an external resistance (i.e., the resistor module 327 as shown in FIG. 7A). Referring to FIG. 7B, a value of the output current (mA) is a function of a value of the external resistance (REXT, (ohm)). By adjusting the external resistance R1, the output current can be changed accordingly. Once the external resistance R1 is fixed, the output current is fixed accordingly.

Figure 8:
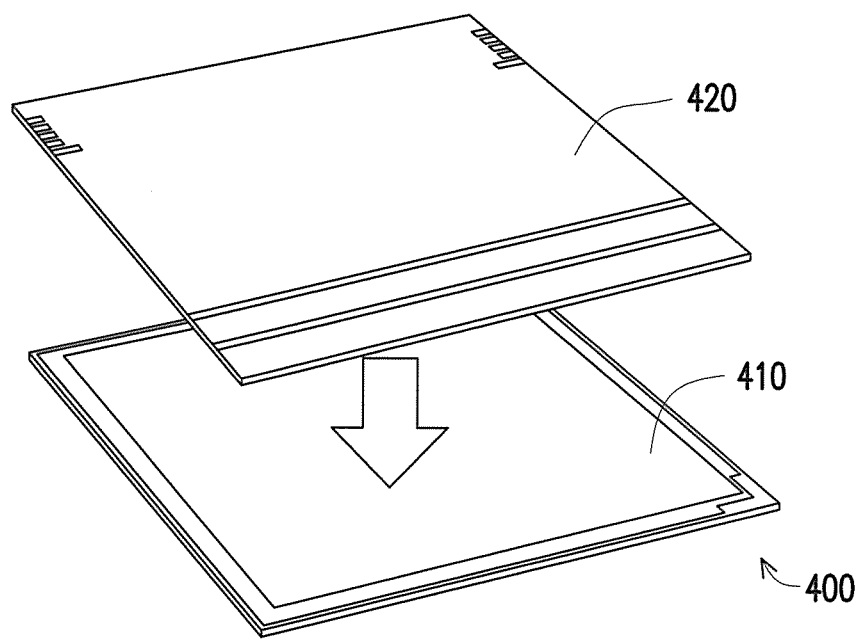
FIG. 8 is a schematic view illustrating a structure of a light emitting element according to an embodiment of the disclosure.

FIG. 8 is a schematic view illustrating a structure of a light emitting element according to an embodiment of the disclosure. Referring to FIG. 8, the light emitting element 400 has a light source 410 and a driving circuit board 420. The driving circuit board 420 is disposed on a side of the light source 410. The light emitting elements 210 and 310 may adopt a detailed structure of the light emitting element 400. Relevant circuits of the driving systems 220 to 220d and 320 for the planar organic electroluminescent device may be disposed on the driving circuit board 420. The arrow sign in FIG. 8 indicates that the light source 410 (e.g., a planar organic electroluminescent light source) and the driving circuit board 420 may be combined to form the light emitting element 400.

Referring to FIG. 8, the driving circuit board 420 may be a printed circuit board (PCB) or a flexible printed circuit (FPC) board. The whole surface of the driving circuit board 420 may be attached onto the light source 410. Electrical connection between the driving circuit board 420 and the light source 410 may be implemented by integration connection of films or bonding. In addition, the light source 410 may be manufactured by thin film packaging, glass packaging, or integration packaging of films.

Figure 9A:
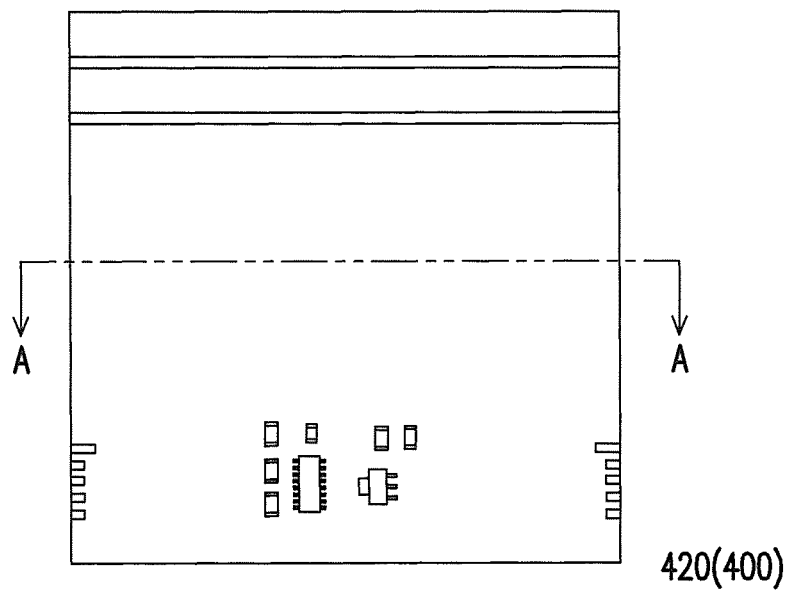
FIG. 9A is a schematic view illustrating a light emitting element according to an embodiment of the disclosure, where the light emitting element of FIG. 9A is provided with a driving circuit board having a sheet resistance.
Figure 9B:
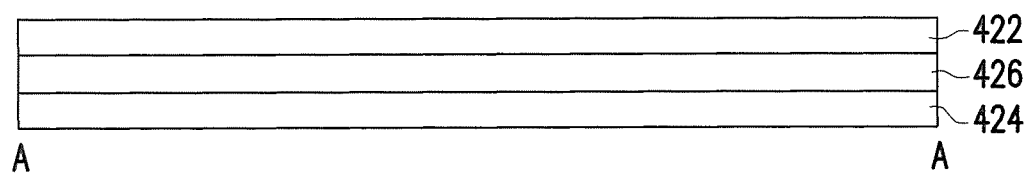
FIG. 9B is a schematic cross-sectional view taken along a cross-sectional line A-A of the driving circuit board of FIG. 9A.
Figure 9C:
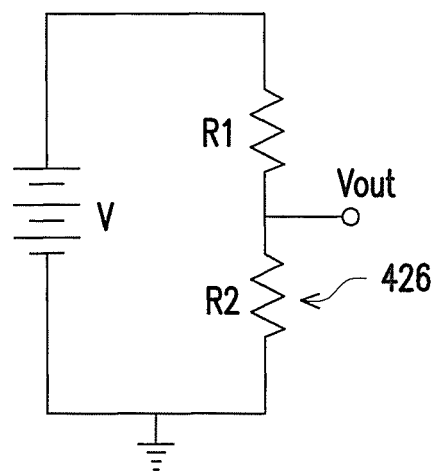
FIG. 9C is an equivalent circuit diagram of FIG. 9A.
Figure 9D:
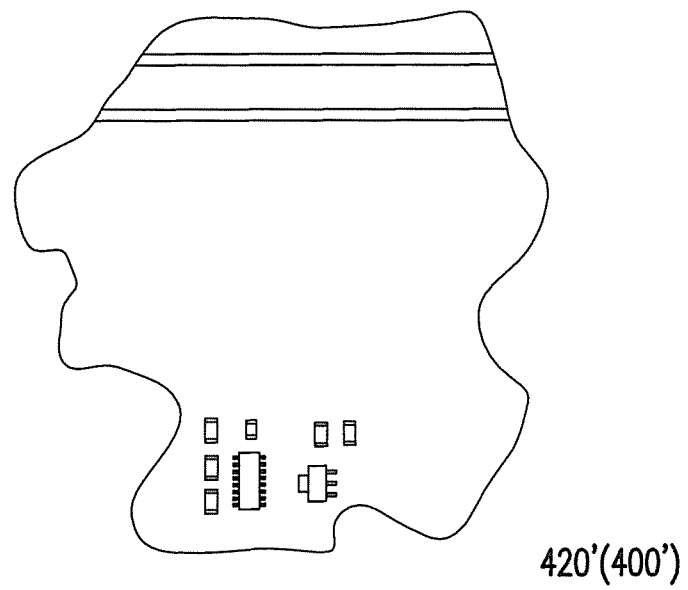
FIG. 9D is a schematic view illustrating performing an arbitrary cutting process to the light emitting element of FIG. 9A.

FIG. 9A is a schematic view illustrating a light emitting element according to an embodiment of the disclosure, where the light emitting element of FIG. 9A is provided with a driving circuit board 420 having a sheet resistance. FIG. 9B is a schematic cross-sectional view taken along a cross-sectional line A-A of the driving circuit board of FIG. 9A. FIG. 9C is an equivalent circuit diagram of FIG. 9A. FIG. 9D is a schematic view illustrating performing an arbitrary cutting process to the light emitting element of FIG. 9A.

Referring to FIG. 9A, the driving circuit board 420 of the light emitting element 400 is illustrated. If the driving circuit board 420 is cut along the cross-sectional line A-A, a cross-sectional structure shown in FIG. 9B is obtained.

Referring to FIG. 9B, the driving circuit board 420 may include a first circuit layer 422, a second circuit layer 424, and a sheet resistance 426. The sheet resistance 426 is disposed between the first circuit layer 422 and the second circuit layer 424. A resistance value of the sheet resistance 426 is positively proportional to an area of the sheet resistance 426.

Referring to the equivalent circuit view of the driving circuit board shown in FIG. 9C, when a constant voltage V is applied, the constant voltage V may correspond to a resistance value R1 of the external resistance and a resistance value R2 of the sheet resistance 426 and generate an output voltage Vout.

For example, when the constant voltage is 5V, and the resistance value R1 of the external resistance is 200 Ohms, if the resistance value R2 of the sheet resistance 426 is 20 Ohms, the output voltage Vout is 0.45V. When the light emitting element 400 (i.e., the driving circuit board 420) is cut to obtain a light emitting element 400' (i.e., a cut driving circuit board 420') in a desired size, as shown in FIG. 9D, since the resistance value of the sheet resistance 426 is positively proportional to the area of the sheet resistance 426, the resistance value R2 is reduced to half if an area of the sheet resistance 426 is reduced to half. Namely, the resistance value R2 is 10 Ohms when the area is reduced to half. Under such circumstance, the output voltage Vout is automatically adjusted to 0.24V.

Referring to FIGS. 7A and 9A to 9D, if the light emitting element 400 of FIGS. 9A to 9D is adopted as the light emitting elements 310 of FIG. 7A, the external resistance (i.e., R1 in FIG. 9C) may be used to adjust a range of the constant current output by the driving module 323, and the resistance value R2 of the sheet resistance 426 may be used to set a driving current. Notice that, the sheet resistance 426 (the resistance value R2) can be embedded in the light emitting element (OLED) or can be mounted on the light emitting element (OLED).

Figure 9E:
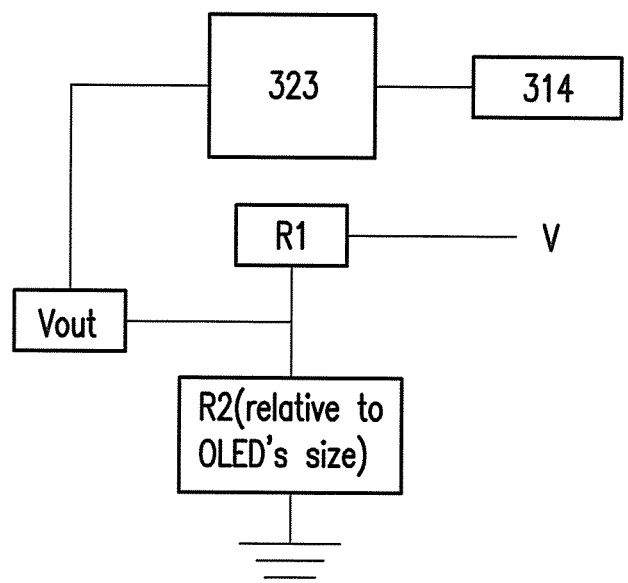
FIG. 9E is a circuit block view illustrating a circuit relation between a sheet resistance of the light emitting element, an external resistance, a driving module, and a second electrode of the light emitting element according to an embodiment of the disclosure.

FIG. 9E is a circuit block view illustrating a circuit relation between a sheet resistance of the light emitting element, an external resistance, a driving module, and a second electrode of the light emitting element according to an embodiment of the disclosure.

In FIG. 9E, the sheet resistance R2 (being changed relative to OLED's size), the external resistance R1, the driving module 323, and the second electrode 314 of the light emitting element exhibit the following connection relationship. The external resistance (i.e., R1 in FIG. 9E) is electrically connected to the sheet resistance (i.e., R2 (being changed relative to OLED's size) in FIG. 9E). In addition, the resistance value of the external resistance is set as R1, the resistance value of the sheet resistance is set as R2, a value of the constant voltage is set as V, and a divided output voltage generated by the circuit of the driving system 320 for the planar organic electroluminescent device (as shown in FIG. 7A) based on variation of the resistance value of the sheet resistance is set as Vout, and Equation (1) in the following is satisfied:

$$V_{out} = V \times R2/(R1+R2) \qquad (1)$$

The resistance value R1 of the external resistance is greater than the resistance value R2 of the sheet resistance. The external resistance (e.g., R1 of FIG. 9E) is able to adjust the range of the constant current output by the driving module 323.

In particular, referring to FIGS. 7, 9C, and 9E, when the resistance value R2 of the sheet resistance changes relative to the size of the light emitting element 310 (OLED), the circuit of the driving system 320 generates the divided output voltage Vout to the driving module 323, and the driving module 323 may output the constant current to the second electrode 314 of the light emitting element 310 based on the divided output voltage Vout. In other words, the driving module 323 may determine a corresponding current value based on the divided output voltage Vout, and output the current to the light emitting element 310. That means, the divided output voltage Vout is used to determine a value of the constant current provided to each of the light emitting element 310. In other words, the current is input to the light emitting element 310 through the second electrode 314.

Moreover, the value of the constant current output by the driving module 323 may be set based on the resistance value R2 of the sheet resistance 426. Namely, the resistance value R2 of the sheet resistance 426 may be used to set the driving current (different constant current) based on the resistance value R2 of the sheet resistance 426. Based on Equation (1), it can be known that, assuming the constant voltage V is fixed and the external resistance R1 is fixed, when the resistance value R2 of the sheet resistance 426 is changed, the output voltage Vout is automatically changed with the resistance value R2 of the sheet resistance 426.

As a result, if the light emitting element 310 is cut, which results in a change in the area of the sheet resistance 426, the resistance value R2 of the sheet resistance 426 is changed, and the divided output voltage Vout is also changed. After the divided output voltage Vout functions at the driving module 323 of an "input voltage reference type", the constant current (driving current) output by the driving module 323 is also changed, thereby achieving automatic adjustment to the driving current (constant current).

In other words, when the light emitting element 400 (i.e., the driving circuit board 420) is cut, the resistance value of the cut light emitting element 400' (i.e., the cut driving circuit board 420') may be automatically adjusted. Namely, with the design of the sheet resistance 426, the driving current that drives the light emitting element 400 with an arbitrary area may be automatically obtained.

Figure 10:
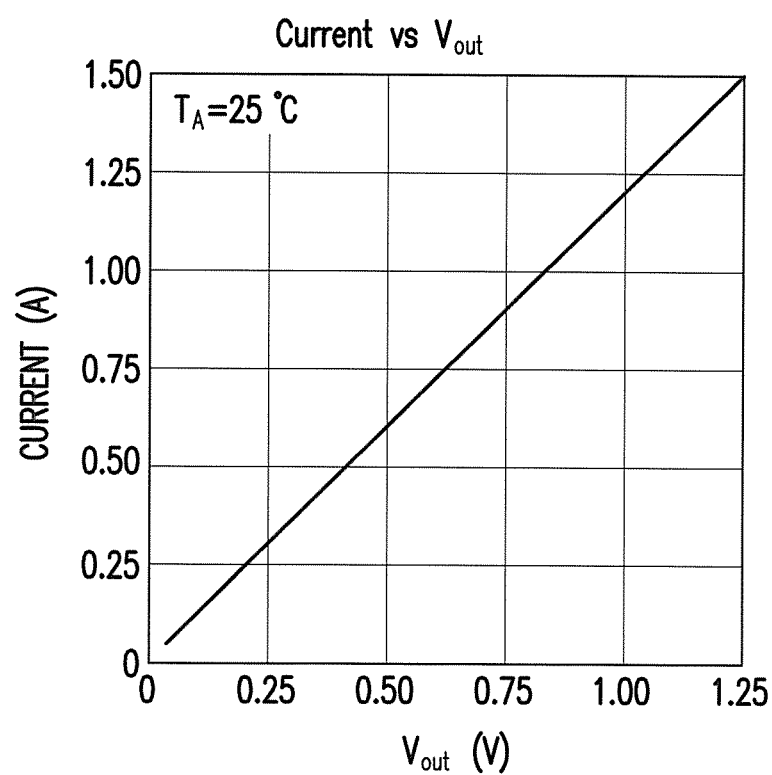
FIG. 10 is a diagram illustrating a relation between an output current and an output voltage under a setting of constant current.
Figure 11:
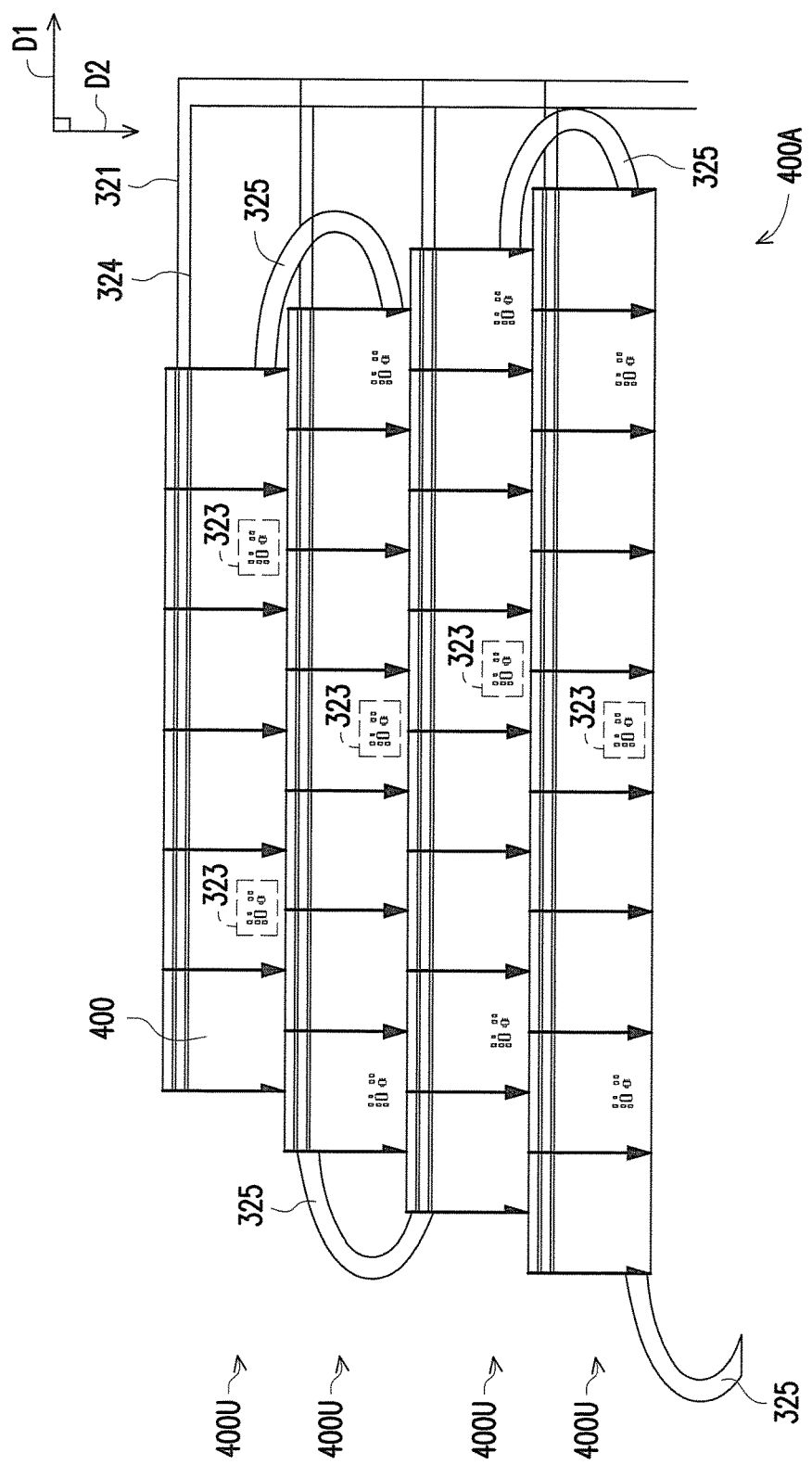
FIG. 11 is a schematic view illustrating a planar organic electroluminescent device where a plurality of light emitting elements are arranged into a two-dimensional arrangement.

FIG. 10 is a diagram illustrating a relation between an output current and an output voltage under a setting of constant current. Referring to FIG. 10, a value of the output current (A) is a function of a value of the output voltage (Vout (V)). FIG. 11 is a schematic view illustrating a planar organic electroluminescent device where aplurality of light emitting elements are arranged into a two-dimensional arrangement. In FIG. 11, components that are the same as those in FIGS. 7 and 8 are referred to by the same reference numerals and will not be repeated in the following. Referring to FIG. 11, a plurality of the light emitting elements 400 are arranged in a first direction D1 to form a plurality of light emitting unit strings 400U. The light emitting unit strings 400U are arranged in a second direction D2 perpendicular to the first direction D1 to form a planar organic electroluminescent device 400A.

It should be noted that, among the light emitting unit strings 400U, the respective first circuits 321 of the light emitting unit strings 400U are connected to one another, the respective ground circuits 324 of the light emitting unit strings 400U are connected to one another, and the respective control circuits 325 of the light emitting unit strings 400U are connected in series with one another. In other words, in the planar organic electroluminescent device 400A, driving power sources (i.e., the first circuits 321 and the ground circuits 324 that provide the constant voltage) of the respective light emitting unit strings 400U are connected to one another, and the control circuits (i.e., the driving modules 323 and the control circuit 325) are connected in series to one another. In this way, the large-sized planar organic electroluminescent device 400A may be manufactured.

Figure 12B:
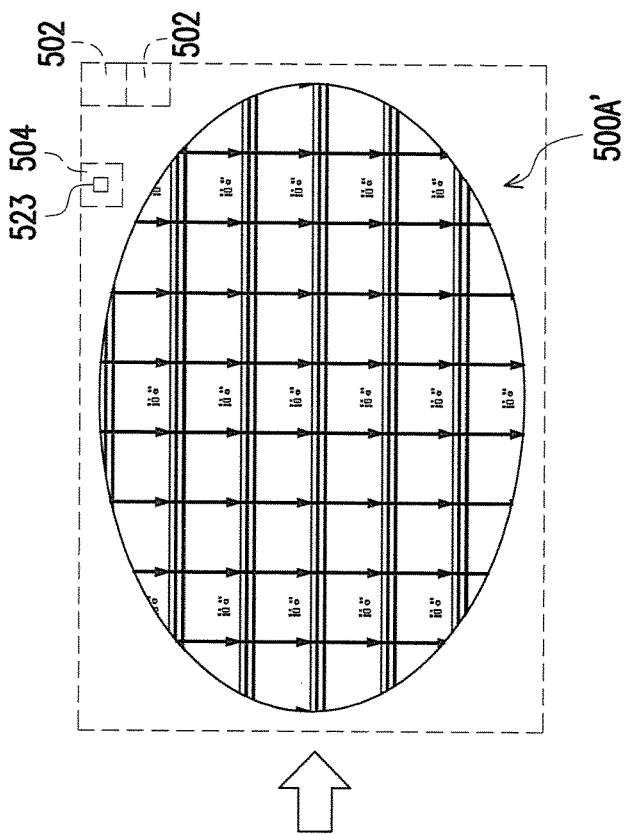
FIG. 12B is a schematic view illustrating performing an arbitrary cutting process to the planar organic electroluminescent device of FIG. 12A.
Figure 12A:
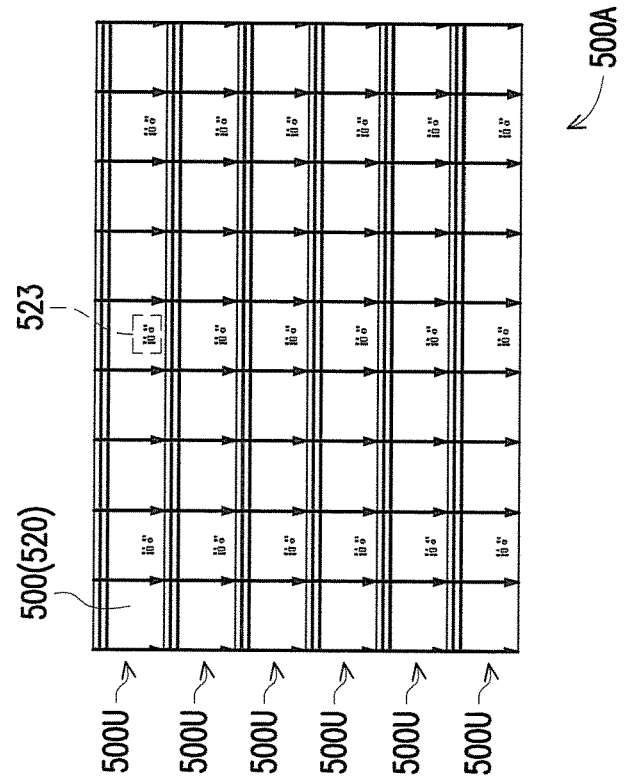
FIG. 12A is a schematic view illustrating a planar organic electroluminescent device where a plurality of light emitting elements including sheet resistances are arranged into a two-dimensional arrangement.

FIG. 12A is a schematic view illustrating a planar organic electroluminescent device where a plurality of light emitting elements including sheet resistances are arranged into a two-dimensional arrangement. FIG. 12B is a schematic view illustrating performing an arbitrary cutting process to the planar organic electroluminescent device of FIG. 12A.

Referring to FIG. 12A, similar to FIG. 11, a plurality of light emitting elements 400 are arranged into a plurality of light emitting unit strings 500U, and the light emitting unit strings 500U are arranged into a planar organic electroluminescent device 500A. In this embodiment, a driving circuit board 520 of each light emitting unit 500 may include the first circuit layer 422, the second circuit layer 424, and the sheet resistance 426. With the design of the sheet resistance 426, the large-sized planar organic electroluminescent device 500A may be cut in an arbitrary way to form a planar organic electroluminescent device 500A' in an arbitrary size and shape as shown in FIG. 12B. Moreover, with the design of the sheet resistance 426, the driving voltage provided to the planar organic electroluminescent device 500A' may be automatically adjusted to smoothly drive the cut planar organic electroluminescent device 500A.

As shown in FIG. 2, the driving module 223 is disposed on at least one of the light emitting elements 210. In addition, the light emitting element 210 where the driving module 223 is disposed serves as the master light emitting element, and the light emitting element 210 where the driving module 223 is not disposed serves as the slave light emitting elements. Similar to FIG. 2, the design having the master and slave light emitting elements may also be adopted in this embodiment. More specifically, referring to FIG. 12B again, after the cutting process, a plurality of residual slave light emitting elements 502 may be electrically bonded to a master light emitting element 504 having a driving module 532, so as to drive the remaining slave light emitting elements 502 after being cut by using the master light emitting element 504.

Figure 13:
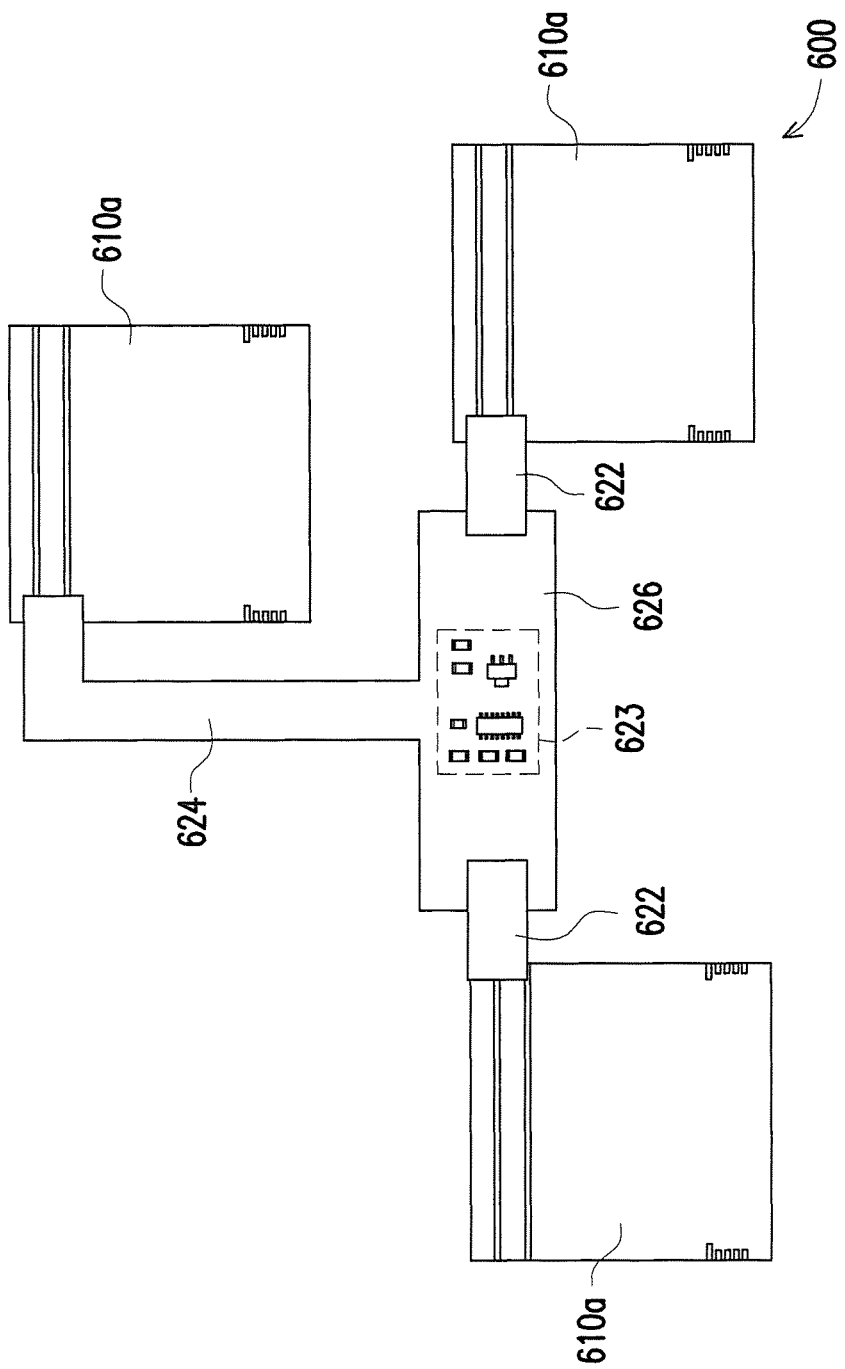
FIG. 13 is a schematic view illustrating a planar organic electroluminescent device according to another embodiment of the disclosure.

FIG. 13 is a schematic view illustrating a planar organic electroluminescent device according to another embodiment of the disclosure. Referring to FIG. 13, in this embodiment, a driving system 600 for a planar organic electroluminescent device may include an independent circuit board 626. A driving module 623 is disposed on the independent circuit board 626. In addition, the independent circuit board 626 having the driving module 623 drives light emitting elements 610a. Similar to FIG. 2, the design having the master and slave light emitting elements may also be adopted in this embodiment. More specifically, referring to FIG. 13, the residual light emitting elements 610a after the cutting process may be electrically bonded to the independent circuit board 626 having the driving module 623, so as to drive the residual light emitting elements 610a after the cutting process by using the independent circuit board 626. With regard to the electrical connection between the independent circuit board 626 and the light emitting elements 610a, the electrical connection may be implemented by using a connector 622 or a connection line 624. It should be noted that the embodiments of the disclosure do not intend to impose a limitation in this regard.

Based on the above, in the driving system for the planar organic electroluminescent device provided in the disclosure, the first electrodes of the light emitting elements are connected to one another, and the light emitting elements are driven by the constant current output by the driving module. In this way, the issue in the conventional technologies that occurs when the light emitting elements are in serial connection may not be present. Moreover, with the design of the sheet resistance, the cutting process may be performed to achieve an arbitrary area and shape.

Figure 14:
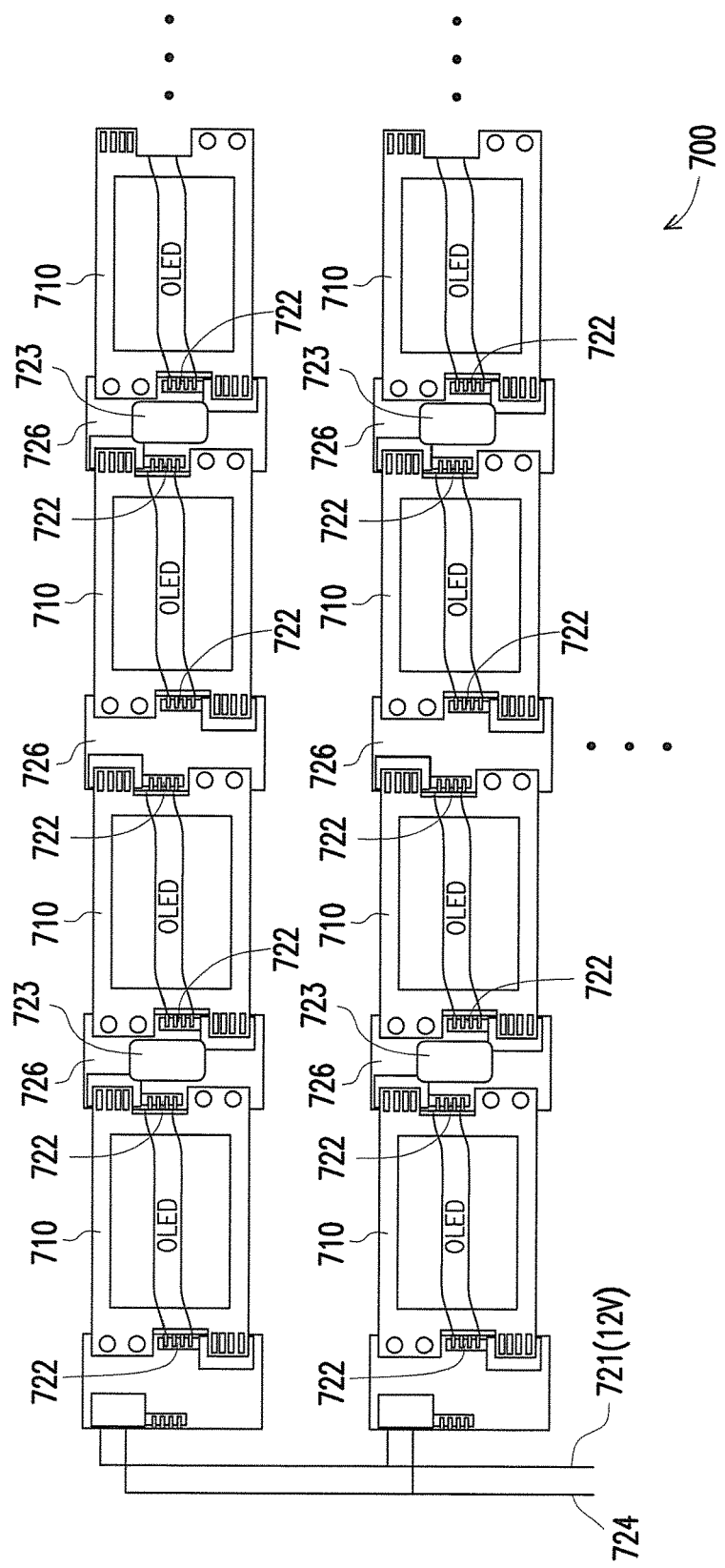
FIG. 14 is a schematic view illustrating a planar organic electroluminescent device according to an embodiment of the disclosure.

FIG. 14 is a schematic view illustrating a planar organic electroluminescent device according to another embodiment of the disclosure. Referring to FIG. 14, a planar organic electroluminescent device 700 may adopt the driving system for the planar organic electroluminescent device according to any one of the embodiments. Referring to FIG. 14, a driving method for the planar organic electroluminescent device 700 of the disclosure is described in the following.

First of all, the driving system for the planar organic electroluminescent device according to any one of the embodiments is provided. It can be seen that, in the embodiment of FIG. 14, a connection circuit board 726 are adopted to connect a plurality of light emitting elements 710. In addition, driving modules 723 are disposed on part of the connection circuit boards 726.

Then, a first circuit 721 is used to provide the constant voltage to each of the light emitting elements 710. The constant voltage may be 12V as shown in FIG. 14. However, in other embodiments, the constant voltage may also be 14V or other suitable voltage values. FIG. 14 also illustrates a ground circuit 724.

Then, by using the driving modules 723, a driving signal is provided to each of the light emitting elements 710 through a second circuit 722, so as to drive an operation of each of the light emitting elements 710.

Referring to FIG. 14 again, a rated current value, such as 2 amperes (A), 3 A, 6 A, of each light emitting element may be set. Then, according to the rated current value, the number of the light emitting elements 710 is determined. In general, about 20 to 30 light emitting elements 710 may be driven.

For example, when the rated current value is X, and a current required by the light emitting element 710 is A, it can be calculated that the number of the light emitting elements 710 that can be driven is X/A. If one of the light emitting elements 710 malfunctions, the required current value is reduced and less than the rated current value X. In other words, the same voltage is provided, but the performance does not need to be as high as 100%.

The driving method for the planar organic electroluminescent device is capable of smoothly driving the planar organic electroluminescent device 700 including the light emitting elements 710 and effectively determining the number of the light emitting elements 710 that are driven.

Besides, in the driving method for the planar organic electroluminescent device as discussed above, a resistor module 327 (R1) may be provided and connected between the driving module 323 and the ground circuit 324 (see FIG. 7A). Thus, a value of the constant current which is should be provided, may be determined based on a value of the resistor module 327 (R1).

In view of the foregoing, in the driving system and the driving method for the planar organic electroluminescent device according to the embodiments of the disclosure, the first electrodes of the light emitting elements are connected to one another, and the light emitting elements are driven by the constant current output by the driving module. In this way, the issue in the conventional technologies that occurs when the light emitting elements are in serial connection may be avoided. In addition, with the design of the sheet resistance, the driving voltage of the planar organic electroluminescent device that is cut is able to be automatically adjusted when the device is cut to achieve an arbitrary area and shape. The driving method for the planar organic electroluminescent device is capable of smoothly driving the light emitting elements and effectively determining the number of light emitting elements that are driven.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A driving system for a planar organic electroluminescent device, comprising:
the planar organic electroluminescent device having a plurality of light emitting elements, and each of the light emitting elements comprising a light source and a driving circuit board disposed on a side of the light source, the light source having a first electrode and a second electrode, and the driving circuit board comprising a sheet resistance, wherein the sheet resistance forms a portion of a voltage divider generating a divided output voltage;
a first circuit, connected to the first electrode of each of the light emitting elements and providing a constant voltage to each of the light emitting elements;
a second circuit, connected to the second electrode of each of the light emitting elements, wherein the first circuit and the second circuit are mechanically separated and spaced apart from one another;
a driving module, connected to the second electrode of each of the light emitting elements through the second circuit, wherein the sheet resistance is electrically connected to the driving module, the divided output voltage is provided by the voltage divider, and the driving module determine a constant current value based on the divided output voltage; and
a ground circuit, connected to the driving module, and the ground circuit connects each of the light emitting elements to the ground,
wherein the first electrodes of the light emitting elements are connected to one another, and the light emitting elements are driven by the constant current output by the driving module.

2. The driving system for the planar organic electroluminescent device as claimed in claim 1, further comprising:
a control circuit, connected to the driving module,
wherein a dimming signal is input to the driving module through the control circuit, so as to exert dimming control on each of the light emitting elements.

3. The driving system for the planar organic electroluminescent device as claimed in claim 1, wherein
the driving module is disposed on at least one of the light emitting elements,
the first circuit, the second circuit, and the ground circuit are disposed on the light emitting elements, and
the second circuit comprises a plurality of sub-circuits, and each of the sub-circuits is respectively connected to each of the second electrodes and the driving module.

4. The driving system for the planar organic electroluminescent device as claimed in claim 3, further comprising:
a control circuit, connected to the driving module,
wherein a dimming signal is input to the driving module through the control circuit, so as to exert dimming control on each of the light emitting elements, and
the first circuit, the second circuit, the ground circuit, and the control circuit are disposed on the light emitting elements.

5. The driving system for the planar organic electroluminescent device as claimed in claim 1, further comprising:
a connection circuit board, wherein
the driving module is disposed on the connection circuit board,
part of the first circuit, part of the second circuit, and the ground circuit are disposed on the connection circuit board,
the first circuit comprises a plurality of first sub-circuits, and each of the first sub-circuits is connected to each of the first electrodes;
the second circuit comprises a plurality of second sub-circuits, and each of the second sub-circuits is connected to each of the second electrodes and the driving module.

6. The driving system for the planar organic electroluminescent device as claimed in claim 5, further comprising:
a control circuit, connected to the driving module,
wherein a dimming signal is input to the driving module through the control circuit, so as to exert dimming control on each of the light emitting elements, and
part of the first circuit, part of the second circuit, the ground circuit, and the control circuit are disposed on the connection circuit board.

7. The driving system for the planar organic electroluminescent device as claimed in claim 1, further comprising:
a connection circuit board, wherein
the first circuit and the ground circuit are disposed on the connection circuit board,
the driving module comprises a plurality of drivers, and each of the drivers is correspondingly disposed on each of the light emitting elements,
the first circuit comprises a plurality of first sub-circuits, and each of the first sub-circuits is respectively and correspondingly connected to each of the first electrodes and each of the drivers,
the ground circuit comprises a plurality of ground sub-circuits, and each of the ground sub-circuits is respectively and correspondingly connected to each of the drivers.

8. The driving system for the planar organic electroluminescent device as claimed in claim 2, further comprising:
a voltage adjustment circuit, connected between the first circuit and the driving module,
wherein the voltage adjustment circuit adjusts the constant voltage to be supplied to the driving module.

9. The driving system for the planar organic electroluminescent device as claimed in claim 1, further comprising:
a resistor module, connected between the driving module and the ground circuit.

10. The driving system for the planar organic electroluminescent device as claimed in claim 1, wherein the driving circuit board further comprises:
a first circuit layer; and
a second circuit layer;
wherein the sheet resistance is disposed between the first circuit layer and the second circuit layer,
wherein a resistance value of the sheet resistance is positively proportional to an area of the sheet resistance.

11. The driving system for the planar organic electroluminescent device as claimed in claim 2, wherein
the light emitting elements are arranged into a plurality of light emitting element strings in a first direction,
the light emitting element strings are arranged into the planar organic electroluminescent device in a second direction perpendicular to the first direction, and among the light emitting element strings, the respective first circuits are connected to one another, the respective ground circuits are connected to one another, and the respective control circuits are connected in series with one another.

12. The driving system for the planar organic electroluminescent device as claimed in claim 11, wherein the driving circuit board further comprises:
a first circuit layer; and
a second circuit layer;
wherein the sheet resistance is disposed between the first circuit layer and the second circuit layer,
wherein a resistance value of the sheet resistance is positively proportional to an area of the sheet resistance.

13. The driving system for the planar organic electroluminescent device as claimed in claim 1, wherein
the driving module is disposed on at least one of the light emitting elements, wherein
the light emitting element where the driving module is disposed serves as a master light emitting element, and
the light emitting element where the driving module is not disposed serves as a slave light emitting element.

14. A driving method for a planar organic electroluminescent device, comprising:
providing the driving system for the planar organic electroluminescent device as claimed in claim 1;
providing the constant voltage to each of the light emitting elements by utilizing the first circuit; and
providing a driving signal to each of the light emitting elements through the second circuit by utilizing the driving module, so as to drive an operation of each of the light emitting elements.

15. The driving method for the planar organic electroluminescent device as claimed in claim 14, further comprising:
setting a rated current value required by each of the light emitting elements, and
determining the number of the light emitting elements based on the rated current value.

16. The driving method for the planar organic electroluminescent device as claimed in claim 14, wherein the driving circuit board further comprises:
a first circuit layer; and
a second circuit layer;
wherein the sheet resistance is disposed between the first circuit layer and the second circuit layer,
wherein a resistance value of the sheet resistance is positively proportional to an area of the sheet resistance.

17. The driving method for the planar organic electroluminescent device as claimed in claim 16, wherein
the resistance value of the sheet resistance is used to determine a value of the constant current output by the driving module.

18. The driving method for the planar organic electroluminescent device as claimed in claim 16, further comprising:
providing an external resistance, electrically connected to the sheet resistance,
wherein if a resistance value of the external resistance is set as R1, a resistance value of the sheet resistance is set as R2, a value of the constant voltage is set as V, and the divided output voltage is set as Vout, Equation 1 in the following is satisfied:

$$V\text{out} = V \times R2/(R1+R2) \quad (1)$$

wherein the resistance value R1 of the external resistance is greater than the resistance value R2 of the sheet resistance, and
the external resistance is able to adjust a range of the constant current output by the driving module.

19. The driving method for the planar organic electroluminescent device as claimed in claim 18, wherein
the divided output voltage is used to determine a value of the constant current provided to each of the light emitting elements.

20. The driving method for the planar organic electroluminescent device as claimed in claim 14, further comprising:
providing a resistor module, connected between the driving module and the ground circuit.

* * * * *